US00RE38293E

(19) United States
(12) Reissued Patent
Osterbrock et al.

(10) Patent Number: US RE38,293 E
(45) Date of Reissued Patent: Nov. 4, 2003

(54) WIRING DEVICE WITH GROUND CLAMPING PLATE

(75) Inventors: James A. Osterbrock, Central Square, NY (US); Michael R. Bryndzia, Baldwinsville, NY (US)

(73) Assignee: Pass & Seymour, Inc., Syracuse, NY (US)

(21) Appl. No.: 09/776,425

(22) Filed: Feb. 2, 2001

Related U.S. Patent Documents

Reissue of:
(64) Patent No.: 5,866,844
Issued: Feb. 2, 1999
Appl. No.: 08/731,086
Filed: Oct. 9, 1996

(51) Int. Cl.[7] ..... H05K 5/02
(52) U.S. Cl. ..... 174/51; 174/57; 220/3.7
(58) Field of Search ..... 174/51, 40 CC, 174/53, 35 R, 57, 65 R, 138 G; 220/3.7; 439/801, 781, 782

(56) References Cited

U.S. PATENT DOCUMENTS

| | | | | |
|---|---|---|---|---|
| 2,260,136 A | | 10/1941 | Bergan | |
| 2,659,877 A | | 11/1953 | Sheldon | |
| 2,684,994 A | * | 7/1954 | Kwake | 174/151 |
| 2,687,517 A | | 8/1954 | Despard | |
| 3,042,094 A | * | 7/1962 | Liljeberg | 411/271 |
| 3,081,507 A | | 3/1963 | Gribble | |
| 3,238,496 A | | 3/1966 | Crowther | |
| 3,414,663 A | * | 12/1968 | Glader | 174/51 |
| 3,509,521 A | | 4/1970 | Gutshall | |
| 3,718,884 A | | 2/1973 | Sheldon | |
| 4,021,094 A | | 5/1977 | Hild et al. | |
| 4,090,762 A | | 5/1978 | Hoffman | |
| 4,312,121 A | * | 1/1982 | Tweed | 29/611 |
| 4,836,793 A | | 6/1989 | Munroe | |
| 4,900,259 A | | 2/1990 | Ludwig et al. | |
| 4,960,964 A | * | 10/1990 | Schnell et al. | 174/151 |
| 5,491,892 A | * | 2/1996 | Fritz et al. | 29/857 |
| 5,519,169 A | * | 5/1996 | Garrett et al. | 174/35 R |
| 5,608,611 A | * | 3/1997 | Szudarek et al. | 361/753 |
| 5,763,830 A | | 6/1998 | Hsueh | |

* cited by examiner

*Primary Examiner*—Dean A. Reichard
*Assistant Examiner*—Dhiru R Patel
(74) *Attorney, Agent, or Firm*—Wall Marjama & Bilinski LLP

(57) ABSTRACT

The present invention relates to electrical wiring devices such as electrical receptacles, switches, and the like, and more particularly to wiring devices with a clamp for the ground connections to such devices. The present invention includes a pressure plate which engages the ground plate of a receptacle with legs of a pressure plate disposed within correspondingly shaped recesses adjacent the ground plate of the receptacle, so that the pressure plate is substantially constrained from rotation relative to the ground plate so that a wire can be received between the ground plate and the pressure plate when the screw is backed out a sufficient distance.

27 Claims, 3 Drawing Sheets

WIRING DEVICE WITH GROUND CLAMPING PLATE

Matter enclosed in heavy brackets [ ] appears in the original patent but forms no part of this reissue specification; matter printed in italics indicates the additions made by reissue.

FIELD OF THE INVENTION

This invention relates generally to electrical wiring devices, such as electrical receptacles, switches, and the like and more particularly to wiring devices with a clamp for the ground connections to such devices.

BACKGROUND OF THE INVENTION

Electrical wiring devices such as outlets, switches, receptacles and the like are commonly provided with screws having enlarged heads under which the bare end of an electrical wire can be captured to form an electrical connection to the device. Wiring devices of the type to which this invention pertains include at least three terminals, a load terminal, a neutral terminal, and a ground terminal. Connections must be made to all three of these terminals in normal use of the wiring device.

Heretofore, clamping plates have sometimes been provided for the load and neutral connections to a wiring device. However, there are special considerations associated with the connection made to the ground terminal of the wiring device that have precluded the use of clamps. When an electrical device is connected in series with other devices, it is desirable to maintain ground continuity through the series string of devices, even when one of the devices is removed. If the ground connections to the wiring device are made by way of two separate connections, then continuity may not be maintained. It is desirable to remove the insulation from a continuous length of ground wire and make the connection to the wiring device without electrically separating the ground wire at the device. In order to encourage this kind of connection, electrical wiring devices are preferably provided with a single screw for making a ground connection to the device, and moreover they are not provided with a clamping plate because the use of a clamping plate at a ground terminal would encourage or at least facilitate the connection of two separate ground wires to the ground terminal, which could be separated when the wiring device was removed or replaced, thus causing a discontinuity in the ground connection at other series connected wiring devices.

When stranded electrical wiring is used to form connections to wiring devices, and particularly when a stranded wire is used for the last electrical wiring devices in a series string of wiring devices, a screw, even a screw with an enlarged head, is not entirely satisfactory for connecting the stranded wire to the wiring device. Even if the strands of the wire are twisted before a connection is made, pressure between the head of the screw and the stranded wire often cause strands to become disassociated from the bundle of remaining strands, and an unsatisfactory connection is thereby made.

It is an object of this invention to provide a wiring device that overcomes the problems of prior art wiring devices, especially with respect to making ground connections to such devices.

SUMMARY OF THE INVENTION

Briefly stated, and in accordance with a presently preferred embodiment of this invention, a wiring device comprises a good plate to which a ground connection is to be made; a treaded opening in the ground plate; a screw engaged with the threaded opening and having an enlarged head; a pressure plate having an opening therethrough and engaging the screw between the screw head and the ground plate of the wiring device; and cooperating means on the ground plate and the pressure plate for substantially preventing rotation of the pressure plate relative to the ground plate when the screw signal is engaged with the pressure plate.

In accordance with another aspect of this invention, the pressure plate includes a bull nose for guiding a wire attached to the wiring device into a fixed location relative to the pressure plate.

In accordance with still another aspect of this invention, the pressure plate includes a cut away region for substantially preventing two separate wires from being simultaneously engaged by the pressure plate, one on each side of the screw.

The novel aspects of the invention are set forth with particularity in the appended claims. The invention itself, together with further objects and advantages thereof may be more readily comprehended by reference to the following detailed description of a presently preferred embodiment of the invention.

DETAILED DESCRIPTION OF THE INVENTION

Figure 1:
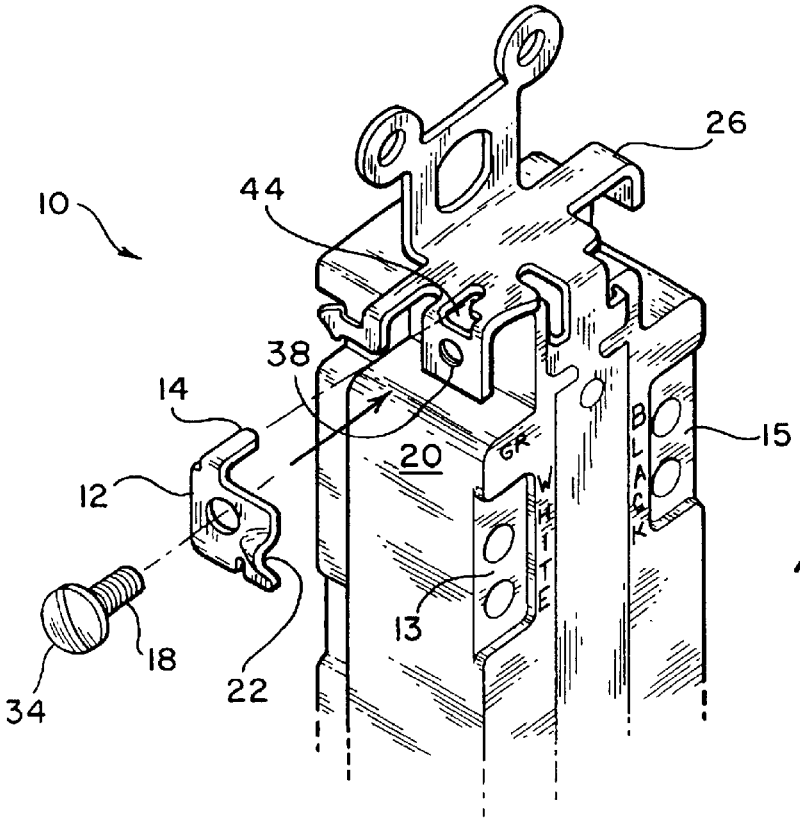
FIG. 1 is a perspective view of the electrical device according to the present invention.

A wiring device 10 of the type to which this invention relates is shown in FIG. 1. The wiring device 10 has a device body 20 with a neutral terminal or terminals 13, a ground terminal 15, and a load terminal or terminals 15 mounted thereon for forming electrical connections to the device. The ground terminal includes an electrically conductive ground plate 26, preferably a metal plate that even more preferably forms the portion of the mechanical structure of the wiring device 10, and includes an internal portion, not shown, for making a connection to a receptacle for receiving a ground prong of an electrical plug adapted to be engaged with the receptacle. The conductive metal ground plate 26 is provided with a threaded through hole 39 extending through a generally rectangular folded tab for receiving a threaded screw 18 having an enlarged head 34 and preferably provided, at a distal end thereof, with an interruption 30 to the thread for preventing the screw 18 from being fully withdrawn from the threaded through hole 38. The threaded through hole 38 in the tab may be located generally centrally with respect to the tab, or preferably offset towards one edge of the tab, or reduce the possibility that two separate wires will be connected to the tab.

A generally U-shaped pressure plate 12 having a generally flat base with a tapered concave bull nose 22 formed at one edge thereof for receiving and guiding an electrical connector under the plate 12, and first and second legs 14, 16 preferably arranged at an approximately 90° angle with respect to the plate 12 for engaging cooperating openings or slots 44 in the ground plate 26 of the electrical receptacle adjacent to the tab to prevent the pressure plate 12 from rotating in use.

Figure 2:
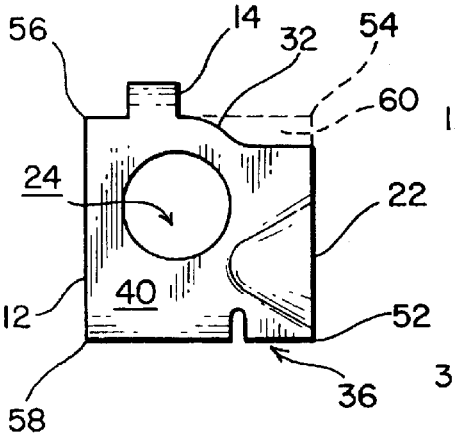
FIG. 2 is a top view of the pressure plate.
Figure 3:
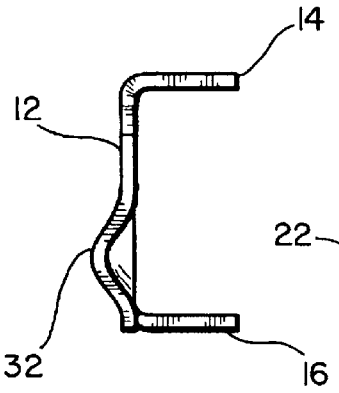
FIG. 3 is a side view of the pressure plate.
Figure 4:
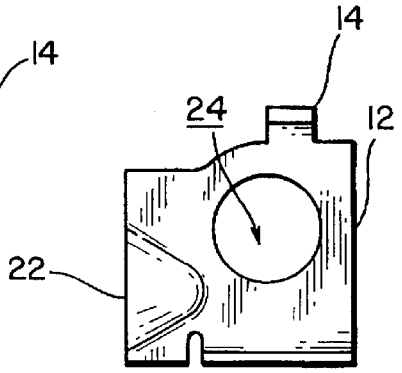
FIG. 4 is a bottom view of the pressure plate.
Figure 5:
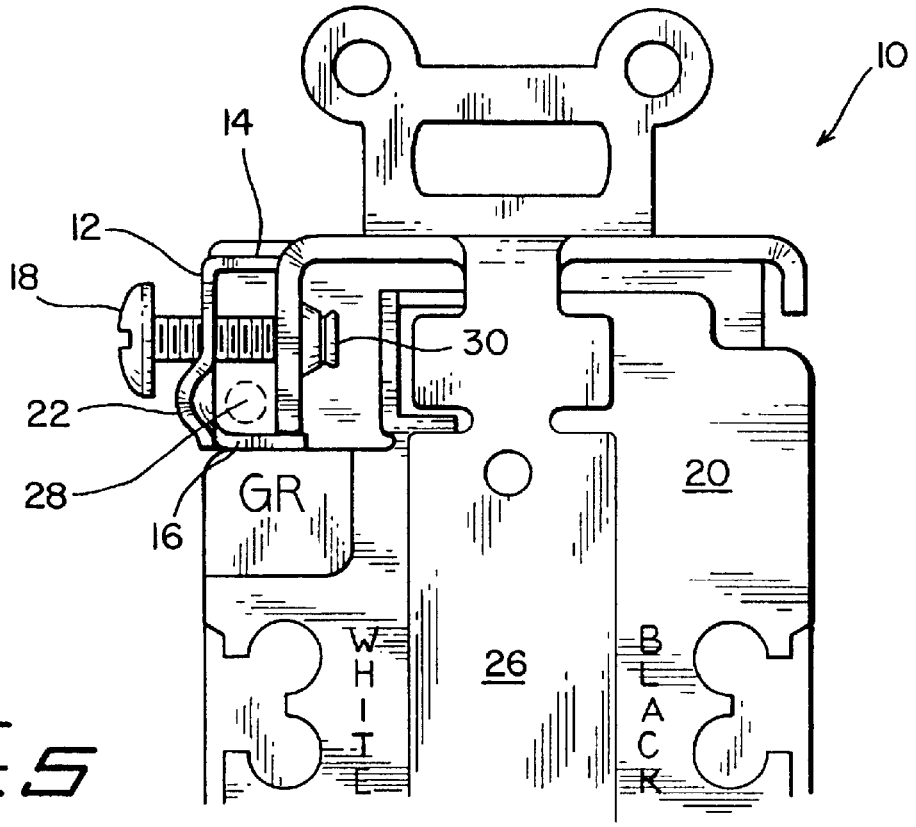
FIG. 5 is a rear view of the electrical device.

Preferably, the pressure plate 12 has a relatively large uninterrupted first portion 36 on one side of a central opening 24, that includes the bull nose 22 for entrapping the end of an electrical conductor between the pressure plate 12 and the ground plate 26 of the wiring device 10, thereby forming a connectable contact device therebetween. The bull nose 22 is preferably tapered towards the opening 24 as shown in FIG. 2. Preferably, the pressure plate 12 has a substantially reduced area 32 between the opposite edge of the plate 12 and the central screw opening 24 for reducing the likelihood that a second separate electrical wire will be connected to the ground plate 26 beneath the other side of the pressure plate 12. The reduced area 32 thus discourages an installer from placing two wires, one on each side of the screw 18 or opening 24, between the pressure plate 12 and the ground plate 26.

Figure 6:
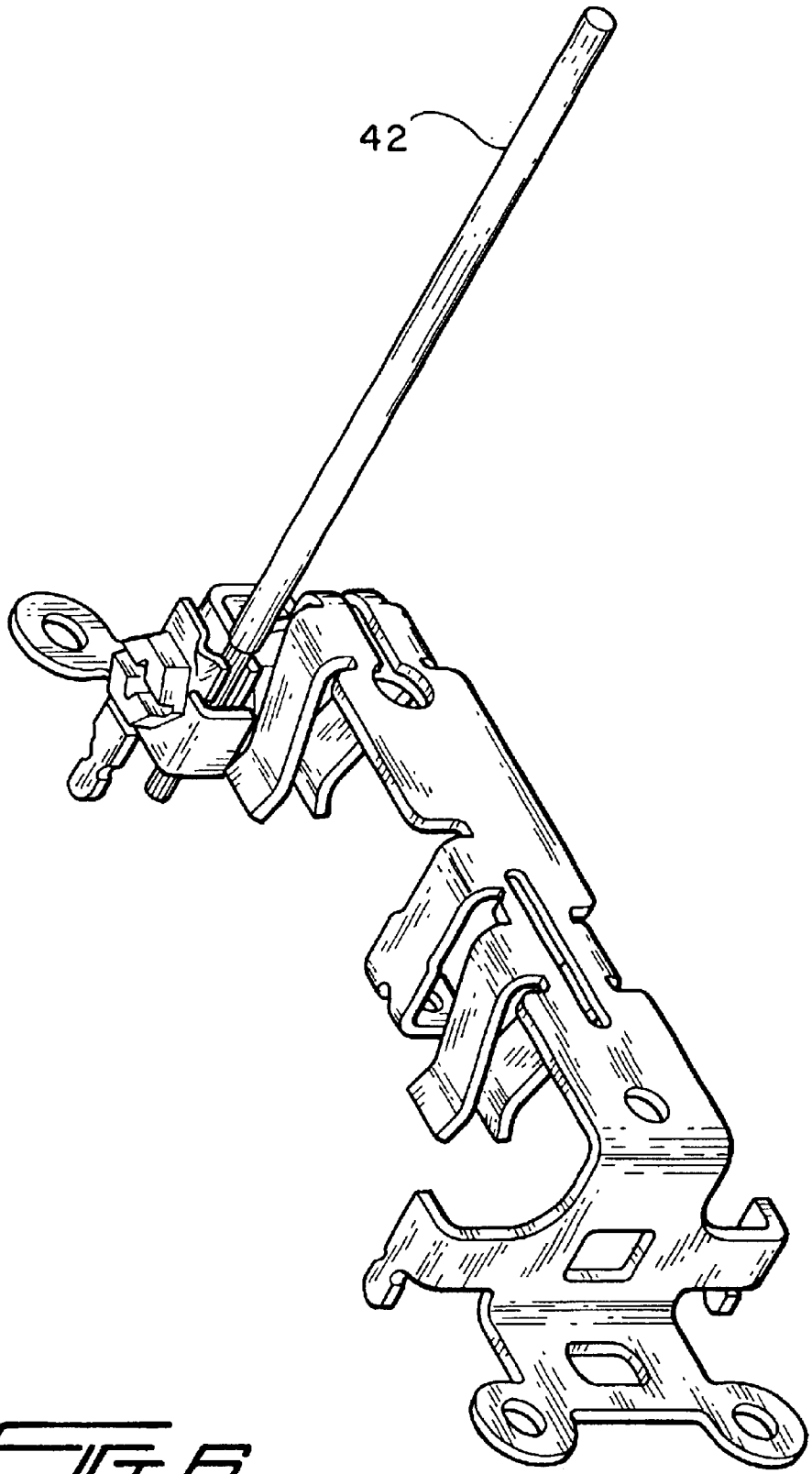
FIG. 6 is a perspective view of the ground plate with the pressure plate and a wire attached.

An electrical wiring device 10 having a pressure plate 12 in accordance with this invention is easy to manufacture. Preferably, as shown in FIG. 6, a ground plate 26 is formed by appropriately punching and bending a ground strap in a configuration shown in FIG. 6 from a sheet of metal material. A through hole 38 is formed in the tab of the ground plate position 26 of the strap, and threaded to receive a screw 18 having an enlarged head 34 therethrough.

A pressure plate 12 having a generally U-shaped configuration with a generally flat and rectangular base or plate 40 and first and second legs 14, 16 is positioned on the ground plate 26 with the legs 14, 16 disposed in correspondingly shaped recesses 44, 46 on the ground plate 26. A first corner 52 of the plate 40 is adjacent the bull nose 22. A second corner 54 of the plate 40 is adjacent the first corner 52 and is cut away from the plate 40 to define a cut-away region 60 which in turn defines the reduced area 32. The leg 14 extends from the plate 40 between the second corner 54 and a third corner 56 of the plate 40. The third corner 56 is diagonally opposite the first corner 52. The second leg 16 extends from the plate 40 between the first corner 52 and a fourth corner 58 of the plate 40.

Preferably, a screw 18 is threaded into the central opening 24 of the pressure plate 12 and the hole 38 of the ground plate 26 substantially completely, so that the threaded end of the screw 18 protrudes from the plate 26 on the opposite side from the heat. The threads at the end of the screw are then preferably interrupted and deformed to prevent the screw from being completely withdrawn from the threaded opening.

The pressure plate 12 engages the ground plate 26 of the receptacle with the legs 14, 16 of the pressure plate 12 disposed within correspondingly shaped recesses adjacent the ground plate 26 of the receptacle, so that the pressure plate 12 is substantially constrained from rotation relative to the ground plate 26, when the screw 18 is backed out sufficiently so that a wire 42 can be received between the ground plate 26 and the pressure plate 12. (See FIG. 6). Without the cooperative restraining action of the legs 14, 16 in the recesses 44, 46, the pressure plate 12 would be free to rotate and could readily become misaligned with the ground plate 26.

The combination of the ground plate 26, pressure plate 12 and screw 18 can then be assembled into a completed receptacle by way of the addition of the remaining elements thereof, without concern that the pressure plate 12 will become detached from the ground plate 26 or misprinted with respect thereto.

*In an alternative embodiment, a leg of the pressure plate extends at approximately a 90 degree angle from the pressure plate, with the leg extending past a portion of the ground plate, which entraps the ground connection when the screw is tightened.*

While the invention has been described in connection with a presently preferred embodiment thereof, those skilled in the art will recognize that many modifications and changes may be made therein without departing from the true spirit and scope of the invention, which accordingly is intended to be defined solely by the appended claims.

We claim:

1. A wiring device comprising:

(a) a ground plate to which a ground connection is to be made;

(b) a threaded opening in the ground plate;

(c) a screw engaged with the threaded opening and having an enlarged head;

(d) a pressure plate having an opening therethrough and engaging the screw between the enlarged head and the ground plate; and (e) a recess on one of the ground plate and the pressure plate and a corresponding leg on the other of the ground plate and the pressure plate for substantially preventing rotation of the pressure plate relative to the ground plate when the screw is engaged with the pressure plate.

2. The wiring device as defined in claim 1 in which the pressure plate includes a bull nose for guiding a wire attached to the wiring device into a fixed location relative to the pressure plate.

3. The wiring device as defined in claim 2 in which the bull nose is concave.

4. The wiring device as defined in claim 1 in which the pressure plate includes a cut-away region for substantially preventing two wires from being simultaneously engaged by the pressure plate, one on each side of the screw.

5. The wiring device as defined in claim 4 in which the screw includes a deformed end opposite the enlarged head for preventing the screw from being withdrawn from the threaded opening while still permitting the screw to be turned.

6. The wiring device as defined in claim 4 in which the ground plate, the screw, and the pressure plate comprise a conducting material.

7. The wiring device as defined in claim 4 in which the pressure plate includes a bull nose for guiding one of the wires attached to the wiring device into a fixed location relative to the pressure plate.

8. The wiring device as defined in claim 7 in which the bull nose is concave.

9. The wiring device as defined in claim 1 in which the screw includes a deformed end opposite the enlarged head for preventing the screw from being withdrawn from the threaded opening, while still permitting the screw to be turned.

10. The wiring device as defined in claim 1 in which the recess is on the ground plate and the corresponding leg is on the pressure plate.

11. The wiring device as defined in claim 1 in which the ground plate, the screw, and the pressure plate comprise a conducting material.

12. A wiring device comprising:

(a) a ground plate to which ground connection is to be made;

(b) a threaded opening in the ground plate;

(c) a screw engaged with the threaded opening and having an enlarged head;

(d) a pressure plate having an opening therethrough and engaging the screw between the enlarged head and the ground plate, and having a cut away region; and, (e) a ground wire electrically entrapped between the pressure plate and the ground plate.

13. The wiring device as defined in claim 12 in which the pressure plate includes a bull nose tapered towards the threaded opening for guiding the ground wire attached to the wiring device towards the threaded opening and into a fixed location between the pressure plate and the ground plate.

14. The wiring device as defined in claim 12 in which the screw includes a deformed end opposite the enlarged head for preventing the screw from being withdrawn from the threaded opening while still permitting the screw to be turned.

15. The wiring device as defined in claim 12 comprising a recess on one of the ground plate and the pressure plate, and a corresponding leg on the other of the ground plate and the pressure plate for substantially preventing rotation of the pressure plate relative to the ground plate, when the screw is engaged with the pressure plate.

16. A pressure plate for electrically entrapping a ground wire against a ground plate, the pressure plate comprising:

a generally rectangular front plate;

a screw opening in a central location of the front plate;

a bull nose positioned near a first corner of the front plate, the bull nose tapered towards the screw opening; and wherein a second corner of the front plate, adjacent the first corner, is cut-away from the front plate to define a cut-away region for substantially preventing two wires from being simultaneously engaged by the pressure plate, one on each side of the screw opening.

17. The pressure plate as defined in claim 16 further comprising a leg, generally perpendicular to the front plate, and extending from between the cut-away region and a third corner, the third corner being diagonally opposite the first corner.

18. The pressure plate as defined in claim 17 further comprising a second leg, generally perpendicular to the front plate, extending from between the first corner and a fourth corner of the front plate.

19. A wiring device comprising:

(a) a ground plate to which ground connection is to be made;

(b) a threaded opening in the ground plate;

(c) a screw engaged with the threaded opening and having an enlarged head;

(d) a pressure plate having an opening therethrough and engaging the screw between the enlarged head and the ground plate, and having a cut away region for discouraging an installer from placing two wires, one on each side of the screw, between the pressure plate and the ground plate; and, (e) a ground wire electrically entrapped between the pressure plate and the ground plate.

*20. A wiring device, comprising:*

*a ground plate to which a ground connection is to be made;*

*a threaded opening in said ground plate;*

*a screw engaged with said threaded opening and having an enlarged head;*

*a pressure plate having an opening therethrough and engaging said screw between said enlarged head and said ground plate of the wiring device; and*

*cooperating means on said ground plate and said pressure plate for substantially preventing rotation of said pressure plate relative to said ground plate when said screw is engaged with said pressure plate;*

*wherein said cooperating means includes a recess on said ground plate and a corresponding leg on said pressure plate.*

*21. A wiring device according to claim 20, wherein said ground plate includes a base plate, said opening for said screw extends through said base plate, and said leg is arranged at an approximately 90 degree angle with respect to said base plate.*

*22. A wiring device, comprising:*

*a ground plate to which a ground connection is to be made;*

*a threaded opening in said ground plate;*

*a screw engaged with said threaded opening and having an enlarged head;*

*a pressure plate having an opening therethrough and engaging said screw between said enlarged head and said ground plate of the wiring device; and*

*cooperating means on said ground plate and said pressure plate for substantially preventing rotation of said pressure plate relative to said ground plate when said screw is engaged with said pressure plate;*

*wherein said cooperating means includes a leg of said pressure plate which extends at approximately a 90 degree angle from said pressure plate, said leg extending past a portion of said ground plate which entraps said ground connection when said screw is tightened.*

*23. A wiring device, comprising:*

*a ground plate to which a ground connection is to be made;*

*a threaded opening in said ground plate;*

*a screw engaged with said threaded opening and having an enlarged head;*

*a pressure plate having an opening therethrough and engaging said screw between said enlarged head and said ground plate of the wiring device;*

*cooperating means on said ground plate and said pressure plate for substantially preventing rotation of said pressure plate relative to said ground plate when said screw is engaged with said pressure plate;*

*wherein said cooperating means includes a hole on said ground plate and a corresponding leg on said pressure plate which extends through said hole when said screw is tightened to bring said pressure plate and said ground plate into electrical contact with said ground connection.*

*24. A wiring device according to claim 23, wherein said ground plate includes a base plate, said opening for said screw extends through said base plate, and said leg is arranged at an approximately 90 degree angle with respect to said base plate.*

*25. A wiring device, comprising:*

*a ground plate to which a ground connection is to be made;*

*a threaded opening in said ground plate;*

*a screw engaged with said threaded opening and having an enlarged head;*

*a pressure plate having an opening therethrough and engaging said screw between said enlarged head and said ground plate of the wiring device;*

*means for discouraging an installer from placing two wires, one on each side of said screw, between said pressure plate and said ground plate; and*

*a ground wire electrically entrapped between said pressure plate and said ground plate.*

*26. A wiring device according to claim 25, wherein said pressure plate includes a generally rectangular portion and said means for discouraging includes said opening in said pressure plate being off-center in said generally rectangular portion.*

*27. A wiring device according to claim 25, wherein said pressure plate includes a generally rectangular portion and said means for discouraging includes a side of said rectangular portion being substantially cut away.*

* * * * *